(12) United States Patent
Kim et al.

(10) Patent No.: US 11,729,920 B2
(45) Date of Patent: Aug. 15, 2023

(54) DISPLAY DEVICE INCLUDING A WINDER

(71) Applicant: SAMSUNG DISPLAY CO., LTD., Yongin-si (KR)

(72) Inventors: Min-Sung Kim, Hwaseong-si (KR); Tae An Seo, Hwaseong-si (KR); Jung Hun Lee, Hwaseong-si (KR); Jin Hwan Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/178,398

(22) Filed: Feb. 18, 2021

(65) Prior Publication Data

US 2021/0195766 A1 Jun. 24, 2021

Related U.S. Application Data

(60) Continuation of application No. 16/585,246, filed on Sep. 27, 2019, now Pat. No. 10,932,375, which is a
(Continued)

(30) Foreign Application Priority Data

Jul. 5, 2016 (KR) .................. 10-2016-0084846

(51) Int. Cl.
*H05K 5/00* (2006.01)
*G06F 1/16* (2006.01)
(Continued)

(52) U.S. Cl.
CPC ..... *H05K 5/0017* (2013.01); *G02F 1/133305* (2013.01); *G06F 1/1652* (2013.01);
(Continued)

(58) Field of Classification Search
CPC .. G09F 9/301; G06F 1/1652; G02F 1/133305; H05K 5/0017; H05K 5/0217
See application file for complete search history.

(56) References Cited

U.S. PATENT DOCUMENTS 5,819,836 A 10/1998 Keil
6,498,597 B1 * 12/2002 Sawano ................. G09F 11/29
345/905
(Continued)

FOREIGN PATENT DOCUMENTS

CN 203746358 7/2014
CN 105009188 10/2015
(Continued)

OTHER PUBLICATIONS

European Search Report dated Dec. 7, 2017 of the corresponding European Patent Application No. 17179556.0.
(Continued)

*Primary Examiner* — Rockshana D Chowdhury
*Assistant Examiner* — Douglas R Burtner
(74) *Attorney, Agent, or Firm* — F. Chau & Associates, LLC

(57) ABSTRACT

A display device including: a display panel configured to display an image; and a winder configured to fix a first end portion of the display panel thereinto, wherein the winder includes a first fixing portion including a first external surface which is curved, and a second fixing portion that includes a second external surface which is curved and that faces the first external surface, wherein the first end portion of the display panel may be interposed between the first external surface and the second external surface.

12 Claims, 10 Drawing Sheets

Related U.S. Application Data division of application No. 15/626,311, filed on Jun. 19, 2017, now Pat. No. 10,455,710.

(51) Int. Cl.

| | |
|---|---|
| *G02F 1/1333* | (2006.01) |
| *G09F 9/30* | (2006.01) |
| *H10K 50/84* | (2023.01) |
| *H05K 5/02* | (2006.01) |
| *H10K 102/00* | (2023.01) |

(52) U.S. Cl.
CPC .......... *G09F 9/301* (2013.01); *H05K 5/0217* (2013.01); *H10K 50/84* (2023.02); *H10K 2102/311* (2023.02)

(56) References Cited

U.S. PATENT DOCUMENTS

| | | | |
|---|---|---|---|
| 7,179,520 B2* | 2/2007 | Saeki | H05K 1/028 |
| | | | 428/209 |
| 9,013,431 B2* | 4/2015 | Choi | G06F 1/1652 |
| | | | 345/173 |
| 9,098,241 B1* | 8/2015 | Cho | G06F 1/1652 |
| 9,349,969 B2 | 5/2016 | Kwon et al. | |
| 9,659,512 B2* | 5/2017 | Lee | G09F 9/301 |
| 9,685,100 B2* | 6/2017 | Choi | G09F 9/301 |
| 9,733,672 B2* | 8/2017 | Kim | G06F 1/1652 |
| 9,760,129 B2 | 9/2017 | Kim et al. | |
| 9,766,660 B2* | 9/2017 | Ryu | G06F 1/1601 |
| 9,788,440 B2* | 10/2017 | Cho | H05K 1/147 |
| 9,870,029 B2* | 1/2018 | Kim | G06F 1/1643 |
| 9,934,706 B2 | 4/2018 | Lim | |
| 10,162,387 B2* | 12/2018 | Takayanagi | H04M 1/0268 |
| 10,257,945 B2* | 4/2019 | Kim | G06F 1/1652 |
| 10,420,227 B2* | 9/2019 | Lee | H05K 5/0217 |
| 10,444,613 B2* | 10/2019 | Seo | G06F 1/1652 |
| 10,455,710 B2 | 10/2019 | Kim et al. | |
| 10,617,017 B2* | 4/2020 | Park | H05K 5/0217 |
| 2002/0070910 A1* | 6/2002 | Fujieda | G06F 1/1652 |
| | | | 345/85 |
| 2005/0040962 A1* | 2/2005 | Funkhouser | G09F 9/301 |
| | | | 340/815.4 |
| 2005/0105748 A1 | 5/2005 | Bartell | |
| 2005/0176470 A1 | 8/2005 | Yamakawa | |
| 2005/0285963 A1* | 12/2005 | Misawa | H04N 5/232411 |
| | | | 348/E5.025 |
| 2006/0098153 A1* | 5/2006 | Slikkerveer | G02F 1/133305 |
| | | | 156/196 |
| 2006/0166713 A1* | 7/2006 | Yeh | G06F 1/1626 |
| | | | 455/575.1 |
| 2006/0176243 A1* | 8/2006 | Yeh | G06F 1/1656 |
| | | | 345/30 |
| 2008/0049003 A1* | 2/2008 | Hasegawa | G06F 1/1637 |
| | | | 345/206 |
| 2008/0144265 A1* | 6/2008 | Aoki | G06F 1/1641 |
| | | | 361/679.04 |
| 2009/0096965 A1* | 4/2009 | Nagata | G02F 1/133305 |
| | | | 313/504 |
| 2009/0267870 A1 | 10/2009 | Schellingerhout et al. | |
| 2010/0033435 A1 | 2/2010 | Huitema | |
| 2010/0246113 A1* | 9/2010 | Visser | G09F 9/301 |
| | | | 361/679.3 |
| 2010/0289983 A1* | 11/2010 | Rocard | G02B 6/0036 |
| | | | 349/84 |
| 2013/0127917 A1* | 5/2013 | Kwack | G06F 1/1652 |
| | | | 345/660 |
| 2014/0002430 A1 | 1/2014 | Kwack et al. | |
| 2014/0104762 A1* | 4/2014 | Park | G06F 1/1637 |
| | | | 361/679.01 |
| 2014/0347827 A1 | 11/2014 | Lee et al. | |
| 2014/0380186 A1* | 12/2014 | Kim | G06F 1/1677 |
| | | | 715/746 |
| 2015/0009636 A1* | 1/2015 | Jeong | B65H 18/10 |
| | | | 361/749 |
| 2015/0029229 A1* | 1/2015 | Voutsas | G06F 1/1647 |
| | | | 345/1.3 |
| 2015/0043142 A1* | 2/2015 | Jang | G06F 1/1601 |
| | | | 361/679.26 |
| 2015/0146069 A1* | 5/2015 | Yamazaki | G06F 1/1626 |
| | | | 361/748 |
| 2015/0173172 A1* | 6/2015 | Yang | G02F 1/133305 |
| | | | 361/749 |
| 2015/0340004 A1* | 11/2015 | Pang | G09G 5/00 |
| | | | 345/205 |
| 2015/0364065 A1* | 12/2015 | Zou | G09F 11/29 |
| | | | 160/309 |
| 2016/0029474 A1 | 1/2016 | Cho et al. | |
| 2016/0034000 A1* | 2/2016 | Lee | G06F 1/1652 |
| | | | 361/749 |
| 2016/0100478 A1* | 4/2016 | Lee | G06F 1/1624 |
| | | | 361/749 |
| 2016/0101610 A1* | 4/2016 | Namkung | B29C 61/065 |
| | | | 156/196 |
| 2016/0135284 A1* | 5/2016 | Choi | G06F 1/1652 |
| | | | 361/749 |
| 2016/0139633 A1* | 5/2016 | Lee | G06F 1/1652 |
| | | | 345/33 |
| 2016/0161983 A1* | 6/2016 | Lee | G09F 9/301 |
| | | | 361/749 |
| 2016/0163242 A1* | 6/2016 | Lee | G09F 9/301 |
| | | | 40/584 |
| 2016/0187929 A1* | 6/2016 | Kim | G06F 1/1643 |
| | | | 345/184 |
| 2016/0209879 A1* | 7/2016 | Ryu | G06F 1/1652 |
| 2016/0320804 A1* | 11/2016 | Takayanagi | G06F 1/1679 |
| 2016/0324021 A1* | 11/2016 | Takayanagi | G06F 1/1652 |
| 2016/0363960 A1* | 12/2016 | Park | G06F 1/1656 |
| 2016/0379589 A1* | 12/2016 | Longo | G06F 1/1652 |
| | | | 345/520 |
| 2017/0013705 A1* | 1/2017 | Jahng | H04M 1/0268 |
| 2017/0023978 A1* | 1/2017 | Cho | G06F 1/1656 |
| 2017/0060183 A1* | 3/2017 | Zhang | G06F 1/1615 |
| 2017/0196102 A1* | 7/2017 | Shin | G06F 1/1607 |
| 2017/0269452 A1* | 9/2017 | Van Lieshout | G02F 1/133305 |
| 2017/0318692 A1* | 11/2017 | Lee | H01L 51/5237 |
| 2017/0318693 A1* | 11/2017 | Kim | H05K 5/0017 |
| 2017/0325342 A1* | 11/2017 | Lee | G06F 1/1652 |
| 2017/0357287 A1* | 12/2017 | Yang | G02F 1/133305 |
| 2017/0367198 A1* | 12/2017 | Park | H04M 1/0268 |
| 2018/0014414 A1 | 1/2018 | Kim et al. | |
| 2019/0146558 A1* | 5/2019 | Ohata | G06F 1/16 |
| | | | 361/679.21 |
| 2019/0150300 A1* | 5/2019 | Kim | H05K 5/0217 |
| | | | 361/807 |
| 2019/0155476 A1 | 5/2019 | Kim et al. | |
| 2019/0204875 A1 | 7/2019 | Lee et al. | |
| 2019/0208650 A1 | 7/2019 | Kim et al. | |
| 2019/0364676 A1 | 11/2019 | Lee et al. | |
| 2020/0029448 A1 | 1/2020 | Kim et al. | |
| 2020/0103476 A1 | 4/2020 | Shin et al. | |

FOREIGN PATENT DOCUMENTS

| | | |
|---|---|---|
| KR | 1020150071788 | 6/2015 |
| KR | 1020150095075 | 8/2015 |
| KR | 20150137216 | * 12/2015 |
| KR | 1020150137216 | 12/2015 |
| KR | 1020160017247 | 2/2016 |
| KR | 1020160022434 | 3/2016 |

OTHER PUBLICATIONS

Chinese Office Action issued in corresponding Chinese Patent Application No. 201710541493.3 dated Aug. 27, 2020.

* cited by examiner

FIG. 6
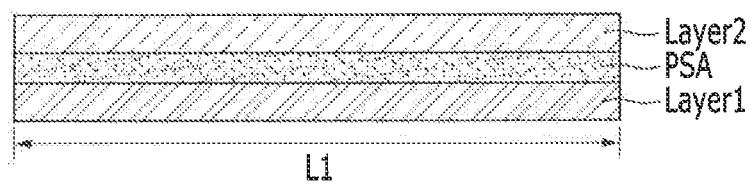
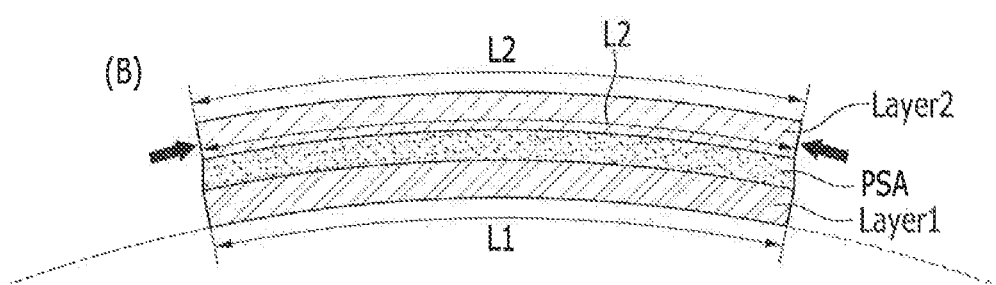

DISPLAY DEVICE INCLUDING A WINDER

CROSS-REFERENCE TO RELATED APPLICATIONS

This application is a continuation of U.S. patent application Ser. No. 16/585,246 filed on Sep. 27, 2019, which is a divisional of U.S. patent application Ser. No. 15/626,311 filed Jun. 19, 2017, now U.S. Pat. No. 10,455,710 issued on Oct. 22, 2019, which claims priority under 35 U.S.C. § 119 to Korean Patent Application No. 10-2016-0084846 filed in the Korean Intellectual Property Office on Jul. 5, 2016 the disclosures of which are incorporated by reference herein their entireties.

TECHNICAL FIELD

The present inventive concept relates to display device.

(b) Description of the Related Art

There are a variety of known display devices, which include a liquid crystal display (LCD), a plasma display panel (PDP), an organic light emitting diode (OLED) display, a field effect display (FED), an electrophoretic display, and the like.

For example, the OLED display includes two electrodes and an organic emission layer interposed therebetween. Electrons injected from one electrode and holes injected from the other electrode are combined in the organic emission layer to generate excitons. The generated excitons release energy to emit light.

The OLED display may be light-weight and thin. In addition, the OLED display has high quality characteristics such as low power consumption, high luminance, and high response speed.

Currently, foldable display devices that can be folded or unfolded and rollable display devices that can be rolled are being developed. To increase the lifetime of the foldable display devices or the rollable display devices, the amount of stress applied to the display panels thereof can be minimized.

SUMMARY

An exemplary embodiment of the present inventive concept provides a display device including: a display panel configured to display an image; and a winder configured to fix a first end portion of the display panel thereinto, wherein the winder may include a first fixing portion including a first external surface which is curved, and a second fixing portion that includes a second external surface which is curved and that faces the first external surface, wherein the first end portion of the display panel may be interposed between the first external surface and the second external surface.

The first external surface may include a first curved surface convexly protruded in a first direction, and a second curved surface that is adjacent to the first curved surface and that is concavely protruded in a second direction.

A curvature radius of the first curved surface may be the same as that of the second curved surface.

A curvature radius of the first curved surface may be different from that of the second curved surface.

The second external surface may include a third curved surface that faces the first curved surface, and a fourth curved surface that is adjacent to the third curved surface, and faces the second curved surface.

A curvature radius of the third curved surface may be the same as that of the fourth curved surface.

A curvature radius of the third curved surface may be different from that of the fourth curved surface.

A curvature radius of the first curved surface may be the same as that of the third curved surface.

A curvature radius of the second curved surface may be the same as that of the fourth curved surface.

The winder may have a cylindrical shape.

The first end portion of the display panel may be wound on the winder.

An adhesive layer may be interposed between the display panel and the first external surface or between the display panel and the second external surface.

The display panel may include a display area for displaying an image and a peripheral area positioned at a periphery of the display area, and the peripheral area of the display panel may be inserted in and fixed to the winder.

The display device may further include a fastening portion that fixes the first fixing portion and the second fixing portion to each other.

The fastening portion may include a bolt passing through the first fixing portion and the second fixing portion, and a nut for engaging with the bolt.

The fastening portion may include a first protrusion disposed at a first end portion of the first fixing portion, a second protrusion disposed at a second end portion of the second fixing portion, and a case configured to receive the first protrusion and the second protrusion.

The first fixing portion and the second fixing portion may be respectively made of stainless steel (SUS), Invar, nickel, cobalt, aluminum, titanium, an alloy thereof, an acryl, or wood.

An exemplary embodiment of the present inventive concept provides a display device including: a display panel configured to display an image; and a winder configured to be connected with a first end portion of the display panel, wherein the winder includes a cut-out groove in which the first end portion of the display panel is inserted and fixed.

The cut-out groove may include a first exposed surface and a second exposed surface facing each other, the first exposed surface may be curved, and the second exposed surface may be curved.

The first exposed surface may include a first curved surface convexly protruded in a first direction, and a second curved surface that is adjacent to the first curved surface and is concavely protruded in a second direction.

A curvature radius of the first curved surface may be the same as that of the second curved surface.

A curvature radius of the first curved surface play be different from that of the second curved surface.

The second exposed surface may include a third curved surface that faces the first curved surface, and a fourth curved surface that is adjacent to the third curved surface, and faces the second curved surface.

A curvature radius of the third curved surface may be the same as that of the fourth curved surface.

A curvature radius of h third curved surface may be different from that of the fourth curved surface.

A curvature radius of the first curved surface may be the same as that of the third curved surface.

A curvature radius of the second curved surface may be the same as that of the fourth curved surface.

An exemplary embodiment of the present inventive concept provides a display device including a display panel including a display area and a peripheral area; and a winder that includes a first portion and a second portion, the first portion having a first curved surface facing a second curved surface of the second portion, wherein the winder is configured to secure a portion of the peripheral area between the first and second curved surfaces.

BRIEF DESCRIPTION OF THE DRAWINGS

FIG. 6 consists of schematic views illustrating processes in which respective films are deformed when stacked films are bent.

DETAILED DESCRIPTION OF THE EMBODIMENTS

Figure 1:
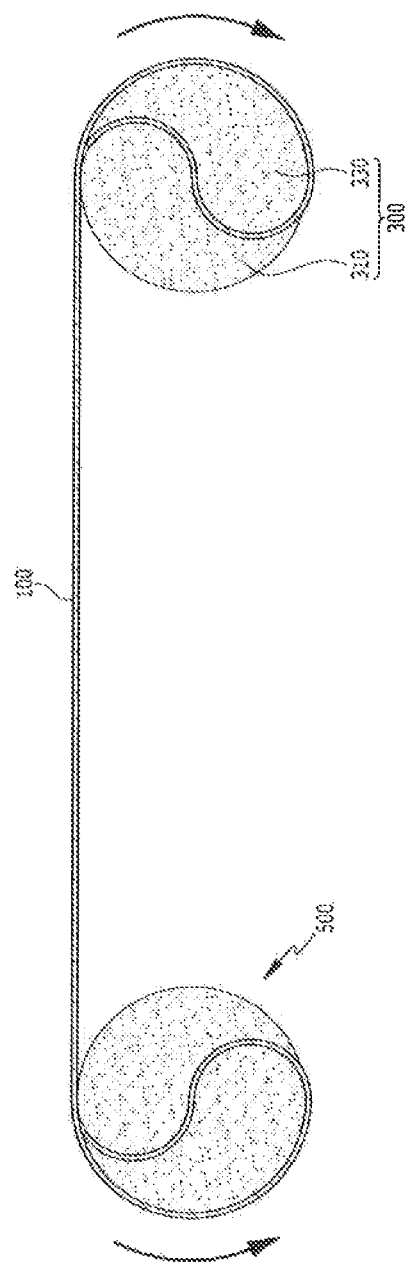
FIG. 1 illustrates a side view of a display device according to an exemplary embodiment of the present inventive concept.

Exemplary embodiments of the present inventive concept will be described more fully hereinafter with reference to the accompanying drawings. As those skilled in the art would realize, the described embodiments may be modified in various different ways, and thus, should not be limited to the embodiments set forth herein. Like reference numerals may designate like elements throughout the specification.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

Hereinafter, a display device according to an exemplary embodiment of the present inventive concept will be described with reference to FIG. 1 to FIG. 5.

Figure 2:
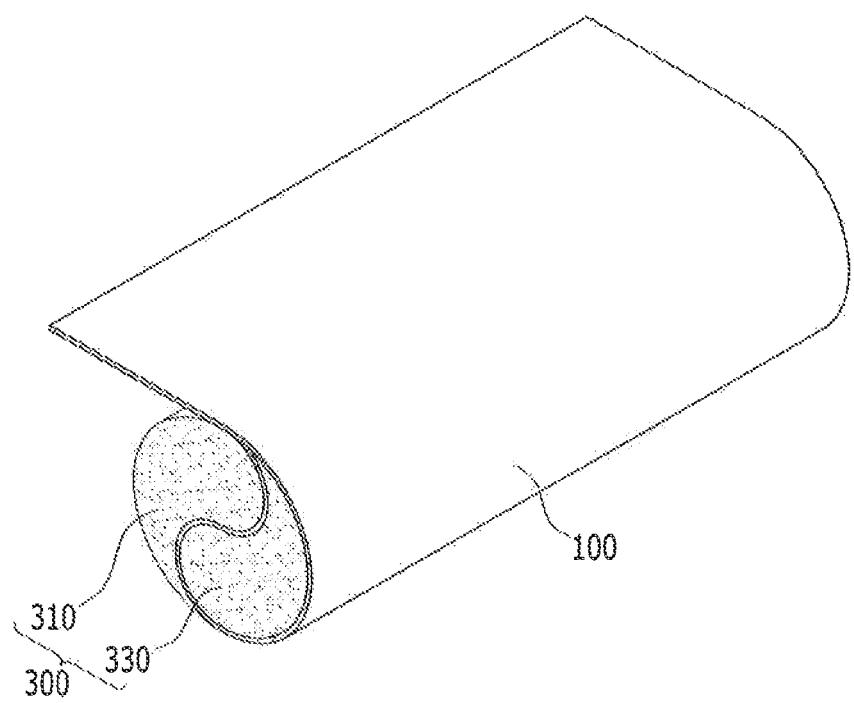
FIG. 2 illustrates a perspective view enlarging a display panel and a winder of FIG. 1 according to an exemplary embodiment of the present inventive concept.
Figure 3:
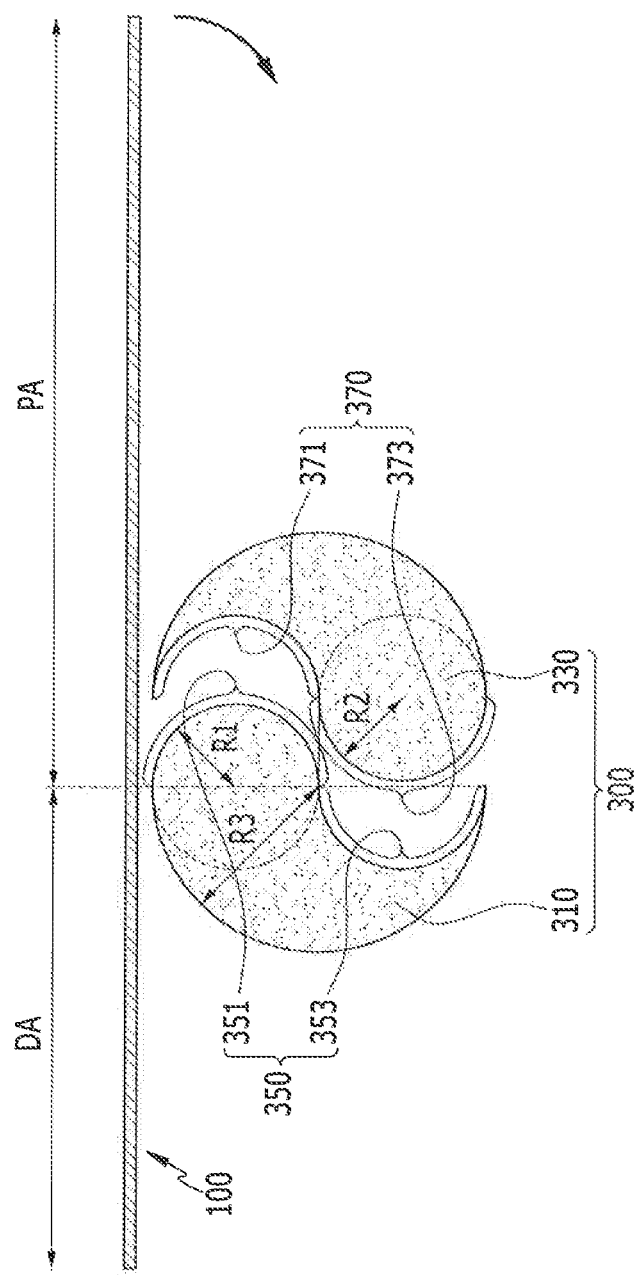
FIG. 3 illustrates an exploded view of the display panel and the winder of FIG. 1 according to an exemplary embodiment of the present inventive concept.
Figure 4:
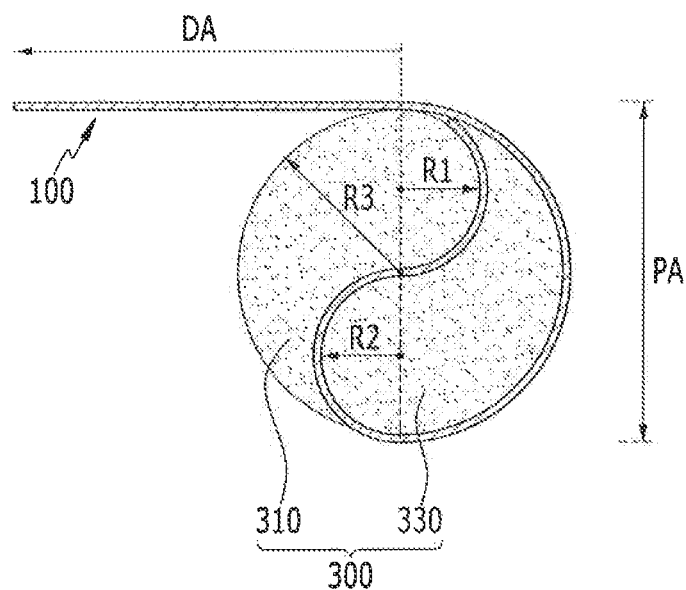
FIG. 4 illustrates a side view enlarging the display panel and the winder of FIG. 1 according to an exemplary embodiment of the present inventive concept.
Figure 5:
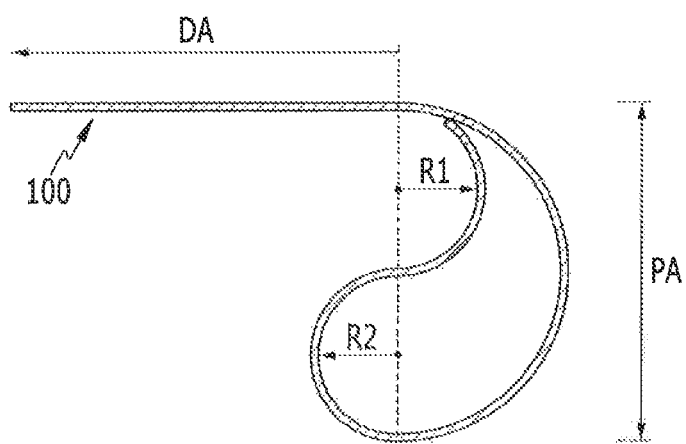
FIG. 5 illustrates a schematic view of the display panel of FIG. 4 according to an exemplary embodiment of the present inventive concept.

FIG. 1 illustrates a side view of a display device according to an exemplary embodiment of the present inventive concept, and FIG. 2 illustrates a perspective view enlarging a display panel and a winder of FIG. 1 according to an exemplary embodiment of the present inventive concept. FIG. 3 illustrates an exploded view of the display panel and the winder of FIG. 1 according to an exemplary embodiment of the present inventive concept, FIG. 4 illustrates a side view enlarging the display panel and the winder of FIG. 1 according to an exemplary embodiment of the present inventive concept, and FIG. 5 illustrates a schematic view of the display panel of FIG. 4 according to an exemplary embodiment of the present inventive concept.

Referring to FIG. 1 to FIG. 4, a display device of the present exemplary embodiment may include a display panel 100, a first winder 300, and a second winder 500. In the present exemplary embodiment, opposite end portions of the display panel 100 may be respectively fixed to the insides of the first winder 300 and the second winder 500. For example, a first end portion of the display panel 100 may be connected to the first winder 300 and a second end portion of the display panel 100 may be connected to the second winder 500. In this case, in the first winder 300 and the second winder 500, by respectively forming external circumferential surfaces of a first fixing portion 310 and a second fixing portion 330 to have a curved surface shape, the display panel 100 interposed between the first fixing portion 310 and the second fixing portion 330 may be fixed in a curved surface shape. As shown in FIGS. 1-4, the external circumferential surfaces of the first and second fixing portions 310 and 330 face each other.

The display panel 100 may display an image by emitting light. For example, the display panel 100 may be a display panel used in a liquid crystal display (LCD), a plasma display panel (PDP), a field effect display (FED), an electrophoretic display, or the like. In addition, the display panel 100 may be a display panel of an organic light emitting device (OLED).

The display panel 100 may be divided into a display area DA and a peripheral area PA. An image may be displayed in the display area DA. In addition, a plurality of pixels may be disposed in the display area DA.

The peripheral area PA corresponds to an area excluding the display area DA. A driving signal line, and a driver, etc. for driving the display area DA may be disposed in the peripheral area PA. In the present exemplary embodiment, the peripheral area PA of the display panel 100 may be inserted in and fixed to the first winder 300 and the second winder 500.

For example, when the peripheral area PA is fixed to the first winder 300 and the second winder 500, and when the first winder 300 and/or the second winder 500 are/is rotated, some of the display area DA as well as the peripheral area PA may be wound on the first winder 300 and/or the second winder 500.

In the present exemplary embodiment, the peripheral area. PA may be disposed at opposite sides of the display area DA. However, the present inventive concept is not limited thereto, and the peripheral area PA may be disposed only at one side of the display area DA. When the peripheral area PA is disposed only at one side of the display area DA, only the first winder 300 may be combined with the display panel 100. Since the second winder 500 applied to the present exemplary embodiment has a structure that is symmetrical with the first winder 300, a detailed description of the second winder 500 will be omitted.

Referring to FIG. 3 and FIG. 4, the first winder 300 may be combined with the peripheral area PA of the display panel 100. For example, the peripheral area PA of the display panel 100 may be inserted in and fixed to the first winder 300.

In the present exemplary embodiment, the first winder 300 include the first fixing portion 310 and the second fixing portion 330. In this case, the first winder 300 may be a cylindrical member that has a cross-section of a third curvature radius R3. The first fixing portion 310 and the second fixing portion 330 may respectively correspond to portions of a cylindrical-shaped member that are cut and divided along a length direction of the first winder 300.

The first fixing portion 310 may include a first external circumferential surface 350. In this case, the first external circumferential surface 350 corresponds to a surface facing the second fixing portion 330, and it may have a curved surface shape.

For example, the first external circumferential surface 350 may include a first curved surface 351 and a second curved surface 353 that are adjacent to each other.

The first curved surface 351 may have a convexly curved shape protruded toward the second fixing portion 330. In this case, the first curved surface 351 may be curved with a first curvature radius R1. Herein, a cross-section of the first curved surface 351 cut in a direction perpendicular to a rotation axis of the first winder 300 may have a semi-circular shape with the first curvature radius R1.

The second curved surface 353 is adjacent to the first curved surface 351, and it may have a concavely curved shape protruded toward the first fixing portion 310 away from the second fixing portion 330. In this case, the second curved surface 353 may be curved with a second curvature radius R2. Herein, a cross-section of the second curved surface 353 cut in a direction perpendicular to a rotation axis of the first winder 300 may have a semi-circular shape with the second curvature radius R2.

As such, the first curved surface 351 and the second curved surface 353 adjacent to each other are respectively formed to have a convex shape and a concave shape. Thus, the cross-section of the first external circumferential surface 350 cut in the direction perpendicular to the rotation axis of the first winder 300 may be similar to a sinusoidal wave shape.

The second fixing portion 330 facing the first fixing portion 310 may include a second external circumferential surface 370. The first external circumferential surface 350 of the first fixing portion 310 and the second external circumferential surface 370 of the second fixing portion 330 may face each other. In this case, the second external circumferential surface 370 may have a curved surface corresponding to the first external circumferential surface 350.

For example, the second external circumferential surface 370 may include a third curved surface 371 and a fourth curved surface 373 that are adjacent to each other.

The third curved surface 371 may be a curved surface that faces the first curved surface 351 of the first fixing portion 310 and corresponds to the first curved surface 351. For example, the third curved surface 371 may be formed with a shape opposite to that of the first curved surface 351. In other words, the third curved surface 371 may have a concavely curved shape protruded toward the second fixing portion 330 away from the first fixing portion 310. In this case, the third curved surface 371 may be curved with the first curvature radius R1 like the first curved surface 351. Similar to the first curved surface 351, a cross-section of the third curved surface 371 cut in a direction perpendicular to the rotation axis of the first winder 300 may have a semi-circular shape with the first curvature radius R1.

The fourth curved surface 373 may be a curved surface that is adjacent to the third curved surface 371 and corresponds to the second curved surface 353. For example, the fourth curved surface 373 may be formed with a shape opposite to that of the second curved surface 353. In other words, the fourth curved surface 373 may have a convexly curved shape protruded toward the first fixing portion 310 away from the second fixing portion 330. In this case, the fourth curved surface 373 may be curved with the second curvature radius R2 like the second curved surface 353. Similar to the second curved surface 353, a cross-section of the fourth curved surface 373 cut in a direction perpendicular to the rotation axis of the first winder 300 may have a semi-circular shape with the second curvature radius R2.

In this case, the third curved surface 371 and the fourth curved surface 373 adjacent to each other are respectively formed to have a concave shape and a convex shape. Thus, a cross-section of the second external circumferential surface 370 cut in a direction perpendicular to the rotation axis of the first winder 300 may be similar to a sinusoidal wave shape and symmetrical to the first external circumferential surface 350.

In the present exemplary embodiment, the first curvature radius R1 and the second curvature radius R2 may be the same. Accordingly, the first curved surface 351 and the second curved surface 353 may have the same size curved surface. The first curved surface 351 and the second curved surface 353 may also be convexly and concavely disposed in different directions, respectively. In addition, the third curved surface 371 and the fourth curved surface 373 may have the same size curved surface. The third curved surface 371 and the fourth curved surface 373 may be convexly and concavely disposed in different directions, respectively.

However, the present inventive concept is not limited thereto, and the first curvature radius R1 and the second curvature radius R2 may be different. For example, the first curvature radius R1 may be greater than the second curvature radius R2, or the first curvature radius R1 may be less than the second curvature radius R2.

In this case, the first external circumferential surface 350 of the first fixing portion 310 and the second external circumferential surface 370 of the second fixing portion 330 correspond to each other. In addition, the first external circumferential surface 350 and the second external circumferential surface 370 may closely contact each other.

Accordingly, in the present exemplary embodiment, by interposing the peripheral area PA of the display panel 100 between the first fixing portion 310 and the second fixing portion 330 facing each other, the peripheral area PA of the display panel 100 can be fixed in the first winder 300. In other words, by interposing the peripheral area PA of the display panel 100 between the first external circumferential surface 350 and the second external circumferential surface 370, and then, by bringing the first external circumferential surface 350 and the second external circumferential surface 370 to each other such that they contact or almost contact, the peripheral area PA of the display panel 100 can be tightly fixed in the first winder 300.

Referring to FIG. 5, the peripheral area PA of the display panel 100 may correspond to the first external circumferential surface 350 (refer to FIG. 3) and the second external circumferential surface 370 (refer to FIG. 3) of the first winder 300 (refer to FIG. 3). For example, the peripheral area PA of the display panel 100 may have not only a convexly curved surface protruded toward the second fixing portion 330 (refer to FIG. 4) away from the first fixing portion 310 (refer to FIG. 4) but also a convexly curved surface protruded toward the first fixing portion 310 (refer to FIG. 4) away from the second fixing portion 330 (refer to FIG. 4).

As such, since all of the surfaces of the peripheral area PA of the display panel 100 are convexly curved in different directions, the peripheral area PA can reduce stress in the display panel 100 of the rollable display device.

Hereinafter, when all of the surfaces of the peripheral area PA of the display panel 100 are convexly curved in different directions, a process in which stress in the display panel 100 is reduced will be described with reference to FIG. 6.

FIG. 6 consists of schematic views illustrating processes in which respective films are deformed when stacked films are bent.

As shown in FIG. 6(A), it is assumed that the display panel applied to the rollable display device has a structure in which a first substrate Layer1, an adhesive layer PSA, and the second substrate Layer2 are stacked. In other words, a first layer is disposed at lower portion of the adhesive layer PSA and a second layer is disposed at a lower portion of the adhesive layer PSA. In this case, it is assumed that each length of the first substrate Layer1, the adhesive layer PSI, and the second substrate Layer2 is a length L1. The first substrate Layer1 and the second substrate Layer2 may be a thin film transistor (TFT) layer, an emission layer, a touch screen panel (TSP) layer, a polarization layer, etc. that are positioned in the display panel.

As shown in FIG. 6(B), when the display panel of FIG. 6(A) is bent with a predetermined curvature, the first substrate Layer1 the adhesive layer PSA, and the second substrate Layer2 may be convexly bent in one direction. In this case, when the display panel is bent with the predetermined curvature, lengths of respective upper and lower surfaces of the first substrate Layer1 and the second substrate Layer2 excluding the adhesive layer PSI may kept the same. For example, each length of the upper and lower surfaces of the first substrate Layer1 may still be identical to the length L1. The length shown in FIG. 6(B) represents an arc length.

The length of the lower surface of the adhesive layer PSA contacting the upper surface of the first substrate Layer1 may be the length L1; however, the length of the upper surface of the adhesive layer PSA may be a length L2 shorter than the length L1. Unlike the first substrate Layer1 and the second substrate Layer2, since the adhesive layer PSA is made of a relatively soft adhesive material, when it is bent, the lengths of the upper and lower surfaces of the adhesive layer PSA may be different. For a closer visual of the differences in the lengths of the upper and lower surfaces of the adhesive layer PSA, refer to the slant in the sides of the adhesive layer PSA in FIG. 6(B).

In addition, the length of the lower surface of the second substrate Layer2 positioned on the upper surface of the adhesive layer PSA may be the length L2. In other words, the length of the lower surface of the second substrate Layer2 may be the same as the length of the upper surface of the second substrate Layer2.

In other words, when the first substrate Layer1, the adhesive layer PSA, and the second substrate Layer2 are convexly bent in one direction, the length L2 of the second substrate Layer2 may be shorter than the length L1 of the first substrate Layer1. Since the adhesive layer PSA is disposed between the first substrate Layer1 and the second substrate Layer2, the second substrate Layer2 positioned on the adhesive layer PSA may become shorter than the length L1 before being bent.

Accordingly, a compressive force is applied to the display panel in the arrow direction shown in FIG. 6(B). In other words, when the sequentially stacked structure is bent, the compressive force may be applied to the display panel due to the adhesive layer PSA. Therefore, a stress is applied to the display panel including the adhesive layer PSA.

However, when the display panel of FIG. 6(A) in which the first substrate Layer1 the adhesive layer PSA, and the second substrate Layer2 are sequentially stacked is bent in different directions, the compressive force applied to the display panel may be offset.

Accordingly, in an exemplary embodiment of the present inventive concept, when the peripheral area PA of the display panel 100 is provided with the surfaces convexly curved in different directions, it is possible to reduce or disperse stress occurring in the display panel 100.

In addition, since the first fixing portion 310 and the second fixing portion 330 closely contact each other, the first, fixing portion 310 and the second fixing portion 330 may be made of a hard material so that the display panel 100 is not separated therefrom. For example, the first fixing portion 310 and the second fixing portion 330 may be respectively made of at least one of stainless steel (SUS), Invar, nickel, cobalt, aluminum, titanium, an alloy thereof, an acryl, and wood.

Referring to FIG. 7 to FIG. 10, a fastening portion 700 that closely and fixedly connects the first fixing portion 310 and the second fixing portion 330 may be combined with the first winder 300. The fastening portion 700 closely fixes the first fixing portion 310 and the second fixing portion 330 to be able to fix the display panel 100 interposed therebetween.

Figure 7:
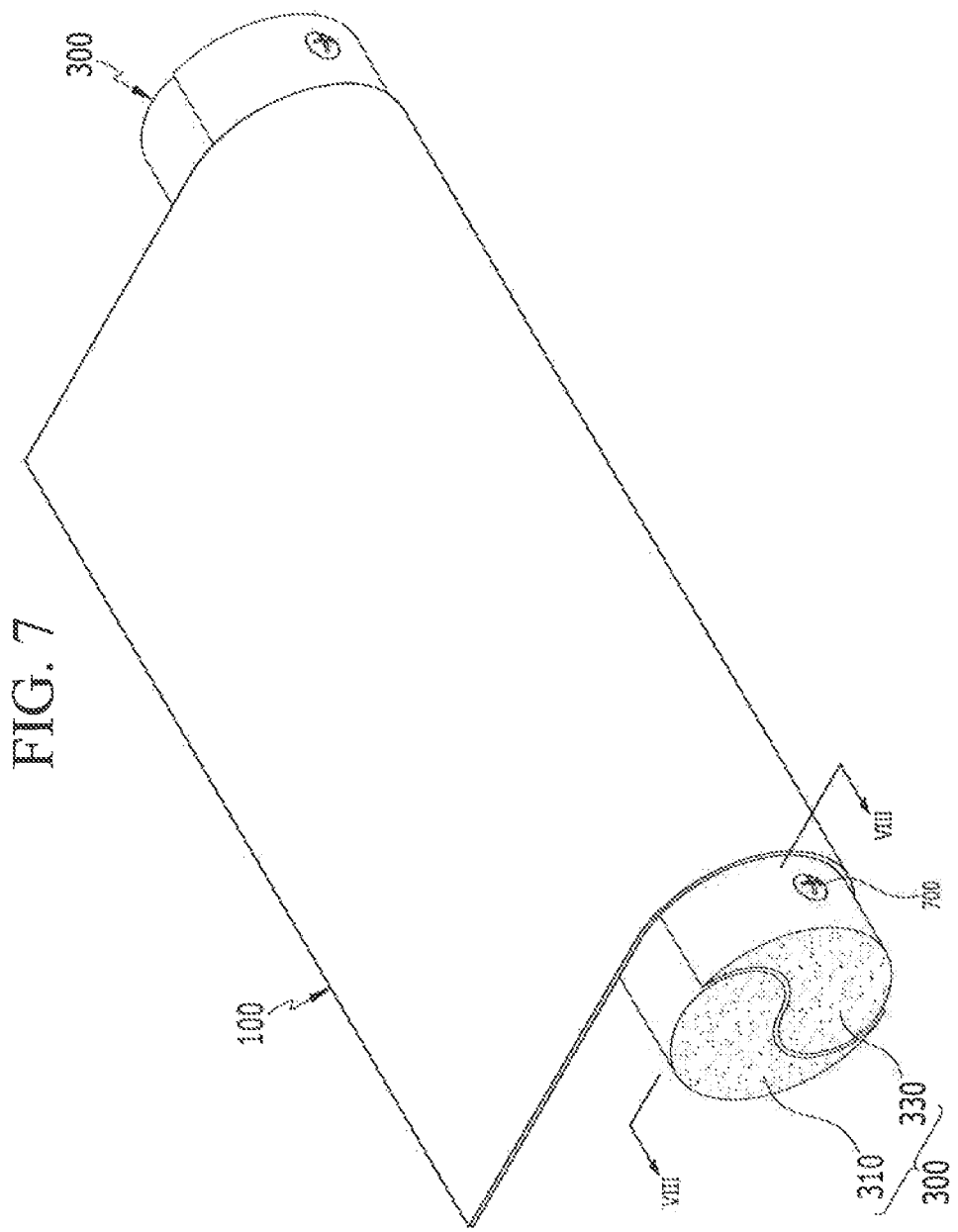
FIG. 7 illustrates a perspective view in which a fastening portion is coupled with a display device of an exemplary embodiment of the present inventive concept.
Figure 8:
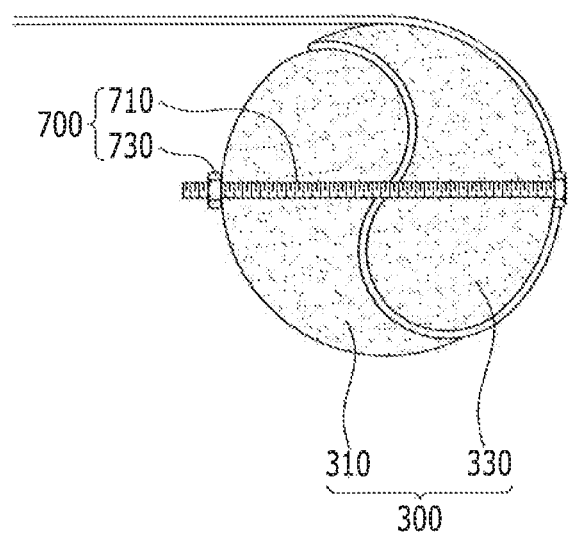
FIG. 8 illustrates a cross-sectional view taken along line VIII-VIII of FIG. 7 according to an exemplary embodiment of the present inventive concept.

In the present exemplary embodiment, referring to FIG. 7 and FIG. 8, the fastening portion 700 may include a bolt 710 and a nut 730. The bolt 710 may pass through the first fixing portion 310 and the second fixing portion 330. The nut 730 may be engaged with the bolt 710 passing through the first fixing portion 310 and the second fixing portion 330. As such, when the bolt 710 and the nut 730 are engaged, the first fixing portion 310 and the second fixing portion 330 closely and tightly contact each other such that the display panel 100 may be disposed within and fixed to the first winder 300.

In this case, the bolt 710 and the nut 730 may be positioned at opposite sides of end portions of the first winder 300. In other words, by positioning the bolt 710 and the nut 730 at opposite sides of the end portions of the first winder 300, the first fixing portion 310 and the second fixing portion 330 can be secured to each other. However, the present inventive concept is not limited thereto, and the bolt 710 and the nut 730 may be positioned at another portion of the first winder 300, for example, a central portion of the first winder 300.

Figure 9:
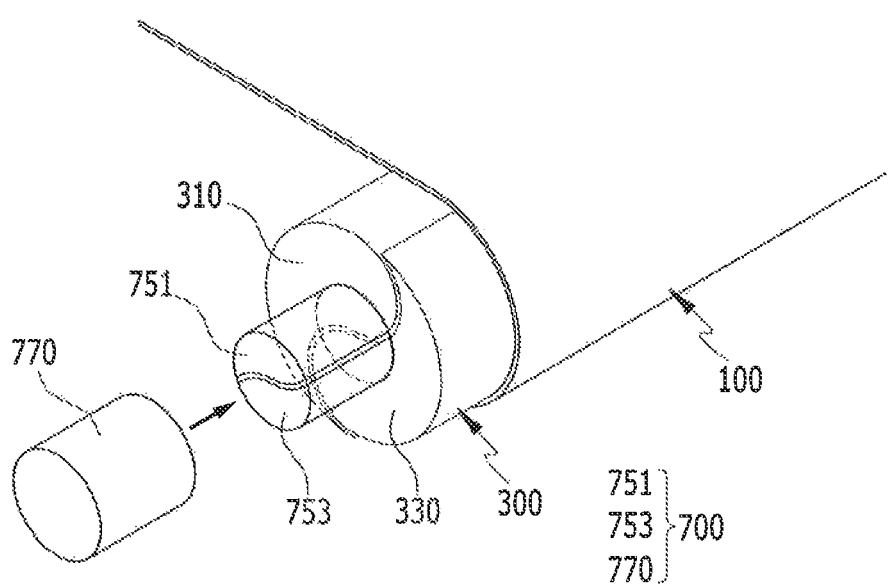
FIG. 9 illustrates a variation of the fastening portion of FIG. 7 according to an exemplary embodiment of the present inventive concept.
Figure 10:
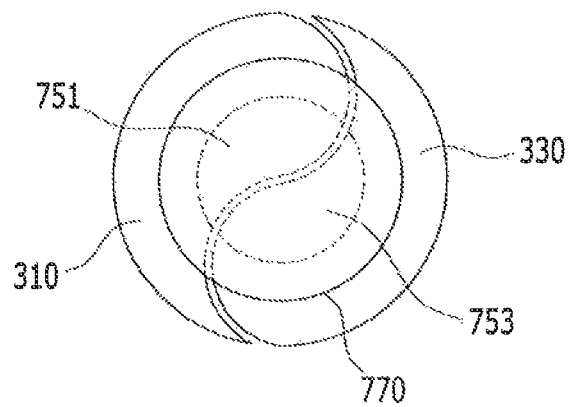
FIG. 10 illustrates a side view of a display device of FIG. 9 according to air exemplary embodiment of the present inventive concept.

FIG. 9 and FIG. 10 illustrate exemplary variations of the fastening portion 700 shown in FIG. 7 and FIG. 8. For example, the fastening portion 700 may include a first protrusion 751, a second protrusion 753, and a cover 770.

The first protrusion 751 is positioned at one end portion of the first fixing portion 310, and protrudes in a length direction of the first fixing portion 310. The second protrusion 753 may be positioned at one end portion of the second fixing portion 330 and protrude in a length direction of the second fixing portion 330. In this case, the first protrusion 751 and the second protrusion 753 may be adjacent to each other. The second protrusion 753 is formed to have a shape corresponding to the first protrusion 751.

The first protrusion 751 and the second protrusion 753 may be fitted into the cover 770. External circumferential surfaces of the first protrusion 751 and the second protrusion 753 form a single cylindrical shape. Thus, an interior circumferential surface of the cover 770 may have a cylindrical shape corresponding to the external circumferential surfaces of the first protrusion 751 and the second protrusion 753. In other words, external circumferential surfaces of the first protrusion 751 and the second protrusion 753 may be fitted into the interior circumferential surface of the cover 770.

An adhesive layer may be interposed between the display panel 100 and the first fixing portion 310 and the second fixing portion 330 so that the display panel 100 may be tightly fixed between the first fixing portion 310 and the second fixing portion 330. For example, an adhesive layer may be interposed between the display panel 100 and the first external circumferential surface 350 of the first fixing portion 310, and an adhesive layer may be interposed between the display panel 100 and the second external circumferential surface 370 of the second fixing portion 330. Further, adhesive layers may be provided at opposite sides of the display panel 100.

Hereinafter, a display device according to an exemplary embodiment of the present inventive concept will be described with reference to FIG. 11 and FIG. 12. In describing the present exemplary embodiment, a detailed description of the same components as those already described above will be omitted.

Figure 11:
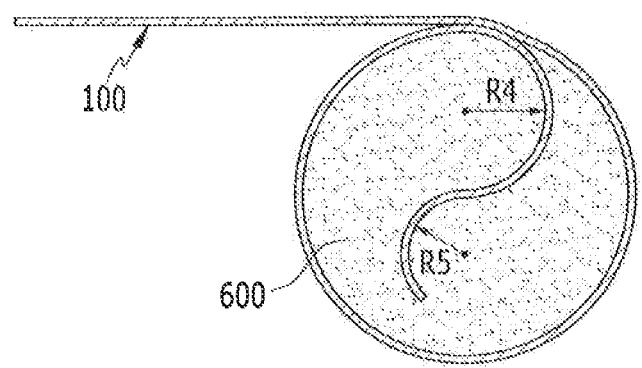
FIG. 11 illustrates a side view of a display device according to an exemplary embodiment of the present inventive concept.
Figure 12:
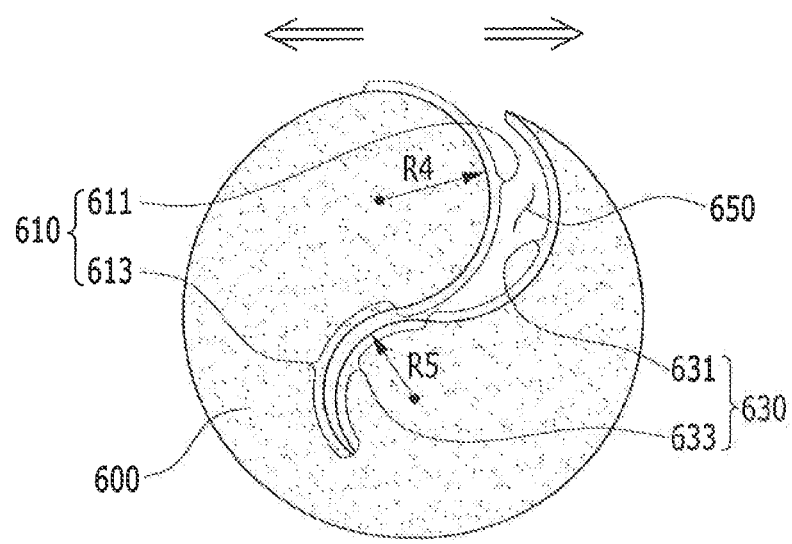
FIG. 12 illustrates a state before a display panel is fixed to a winder of FIG. 11 according to an exemplary embodiment of the present inventive concept.

FIG. 11 illustrates a side view of a display device according to an exemplary embodiment of the present inventive concept, and FIG. 12 illustrates a state before a display panel is fixed to a winder of FIG. 11 according to an exemplary embodiment of the present inventive concept.

Referring to FIG. 11 and FIG. 12, the display device of the present exemplary embodiment may include the display panel 100 and a third winder 600. In the present exemplary embodiment, a cut-out groove 650 is formed in the third winder 600, and the peripheral area (PA; refer to FIG. 3) of the display panel 100 may be inserted into and fixed in the cut-out groove 650. This is different from the display panel 100 of FIG. 3 which fixes the peripheral area (PA; refer to FIG. 3) of the display panel 100 between the first fixing portion 310 and the second fixing portion 330, while the first fixing portion 310 and the second fixing portion 330 are separated from each other. For example, in this embodiment the display panel 100 is fixed in the single cut-out groove 650 that does not split the third winder 600 completely apart.

In the present exemplary embodiment, the cut-out groove 650 of the third winder 600 may be formed by a third external circumferential surface 610 and a fourth external circumferential surface 630 facing each other. In this case, the third external circumferential surface 610 and the fourth external circumferential surface 630 may have a curved surface, and the shapes of the third external circumferential surface 610 and the fourth external circumferential surface 630 may correspond to each other.

For example, the third external circumferential surface 610 may include a fifth curved surface 611 and a sixth curved surface 613 adjacent to each other.

The fifth curved surface 611 may have a convexly curved shape protruded toward the fourth external circumferential surface 630. In this case, the fifth curved surface 611 may be curved with a fourth curvature radius R4. Herein, a cross-section of the fifth curved surface 611 cut in a direction perpendicular to the rotation axis of the third winder 600 may have a semi-circular shape with the fourth curvature radius R4.

The sixth curved surface 613 is adjacent to the fifth curved surface 611, and it may be formed to have a concavely curved shape protruded toward the third external circumferential surface 610 away from the fourth external circumferential surface 630. In this case, the sixth curved surface 613 may be curved with a fifth curvature radius R5. Herein, a cross-section of the sixth curved surface 613 cut in a direction perpendicular to the rotation axis of the third winder 600 may have a semi-circular shape with the fifth curvature radius R5.

As such, the fifth curved surface 611 and the sixth curved surface 613 adjacent to each other respectively have a convex shape and a concave shape. In addition, a cross-section of the third external circumferential surface 610 cut in a direction perpendicular to the rotation axis of the third winder 600 may be similar to a sinusoidal wave shape.

The fourth external circumferential surface 630 may include a seventh curved surface 631 and an eighth curved surface 633 adjacent to each other.

The seventh curved surface 631 may be a curved surface that faces the fifth curved surface 611 of the third external circumferential surface 610 and corresponds to the fifth curved surface 611. For example, the seventh curved surface 631 may have a shape opposite to that of the fifth curved surface 611. In other words, the seventh curved surface 631 may be concavely curved toward the fourth external circumferential surface 630 and protruded away from the third external circumferential surface 610. In this case, the seventh curved surface 631 may be curved with the fourth curvature radius R4 like the fifth curved surface 611. Similar to the fifth curved surface 611, a cross-section of the seventh curved surface 631 cut in a direction perpendicular to the rotation axis of the third winder 600 may have a semi-circular shape with the fourth curvature radius R4.

The eighth curved surface 633 may be a curved surface that is adjacent to the seventh curved surface 631 and corresponds to the sixth curved surface 613. For example, the eighth curved surface 633 may have a shape opposite to that of the sixth curved surface 613. In other words, the eighth curved surface 633 may have a convexly curved shape protruded toward the third external circumferential surface 610 and away from the fourth external circumferential surface 630. In this case, the eighth curved surface 633 may be curved with the fifth curvature radius R5 like the sixth curved surface 613 that faces the eighth curved surface 633. Similar to the sixth curved surface 613, a cross-section of the eighth curved surface 633 cut in a direction perpendicular to the rotation axis of the third winder 600 may have a semi-circular shape with the fifth curvature radius R5.

In this case, the seventh curved surface 631 and the eighth curved surface 633 adjacent to each other respectively have a concave shape and a convex shape. In addition, a cross-section of the fourth external circumferential surface 630 cut in a direction perpendicular to the rotation axis of the third winder 600 may be similar to a sinusoidal wave shape symmetrical to the third external circumferential surface 610.

In the present exemplary embodiment, the fourth curvature radius R4 and the fifth curvature radius R5 may be the same. Accordingly, the fifth curved surface 611 and the sixth curved surface 613 may be formed with curved surfaces of the same size, and may be convexly and concavely disposed in different directions, respectively. In addition, the seventh curved surface 631 and the eighth curved surface 633 may be formed with curved surfaces of the same size, and may be concavely and convexly disposed in different directions, respectively.

However, the present inventive concept is not limited thereto, and the fourth curvature radius R4 and the fifth curvature radius R5 may be different. For example, fourth curvature radius R4 may be greater than the fifth curvature radius R5, or the fourth curvature radius R4 may be less than the fifth curvature radius R5.

In this case, the third external circumferential surface 610 and the fourth external circumferential surface 630 correspond to each other. Thus, the third external circumferential surface 610 and the fourth external circumferential surface 630 may closely contact each other.

Accordingly, in the present exemplary embodiment, by disposing the peripheral area PA of the display panel 100 in the cut-out groove 650 formed by the third external circumferential surface 610 and the fourth external circumferential surface 630, it is possible to fix the peripheral area PA of the display panel 100 in the third winder 600.

According to an exemplary embodiment of the present inventive concept, it is possible to prevent a display panel of a display device from being broken due to stress.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed s:

1. A display device, comprising:
  a display panel configured to display an image; and
  a winder configured to fix a first end portion of the display panel thereinto and configured to rotate to wind the display panel,
  wherein the winder includes:
  a first fixing portion including a first surface which is curved,
  a second fixing portion including a second surface which is curved and that faces the first surface, and
  a fastening portion that extends through an external side of the first fixing portion to an external side of the second fixing portion to fix the first fixing portion and the second fixing portion to each other.

2. The display device of claim 1, wherein the end portion of the display panel is interposed between the first surface and the second surface.

3. The display device of claim 2, wherein the display panel includes:
  a first layer and a second layer, and
  an adhesive layer between the first layer and the second layer,
  wherein the end portion of the display panel is bent with a predetermined curvature.

4. The display device of claim 3, wherein a length of an upper surface of the adhesive layer is shorter than a length of a lower surface of the adhesive layer.

5. A display device, comprising:
  a display panel configured to display an image; and
  a winder configured to fix a first end portion of the display panel thereinto and configured to rotate to wind the display panel,
  wherein the winder includes:
  a first fixing portion including a first surface which is curved,
  a second fixing portion including a second surface which is curved and that faces the first surface, and
  a fastening portion that fixes the first fixing portion and the second fixing portion to each other,
  wherein the first surface and the second surface are curved in an S-shape.

6. The display device of claim 1, wherein the first surface includes:
  a first curved portion convexly protruded in a first direction, and
  a second curved portion that is adjacent to the first curved surface and that is concavely protruded in a second direction opposite the first direction.

7. The display device of claim 1, wherein the winder has a cylindrical shape, and the end portion of the display panel is wound on the winder.

8. The display device of claim 1, further comprising:
  an adhesive layer interposed between the display panel and the first surface or between the display panel and the second surface.

9. The display device of claim 1, wherein the display panel includes a display area for displaying an image and a peripheral area adjacent to the display area, and
  the end portion of the display panel is positioned at the peripheral area and the end portion of the display panel is inserted in and fixed to the winder.

10. The display device of claim 1, wherein the fastening portion includes:
  a bolt passing through the first fixing portion and the second fixing portion, and a nut for engaging with the bolt.

11. The display device of claim 1, wherein the fastening portion includes:
  a first protrusion disposed at a first end portion of the first fixing portion,
  a second protrusion disposed at a second end portion of the second fixing portion, and
  a case configured to receive the first protrusion and the second protrusion.

12. A display device, comprising:
  a display panel;
  a winder configured to wind the display panel and including:
  a first portion having a first curved surface, and
  a second portion having a second curved surface that faces the first curved surface; and
  a fastener extending from a side of the first portion to a side of the second portion and fixing the first portion and the second portion to each other,
  wherein the winder is configured to secure a portion of the display panel between the first curved surface and the second curved surface, and
  wherein the fastener includes a bolt passing through the first portion and the second portion, and a nut for engaging with the bolt.

* * * * *